(12) United States Patent
Park et al.

(10) Patent No.: US 10,925,163 B2
(45) Date of Patent: Feb. 16, 2021

(54) PRINTED CIRCUIT BOARD

(71) Applicant: Samsung Electro-Mechanics Co., Ltd., Suwon-si (KR)

(72) Inventors: Je Sang Park, Suwon-si (KR); Sang Ho Jeong, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 16/739,217

(22) Filed: Jan. 10, 2020

(65) Prior Publication Data

US 2020/0396839 A1 Dec. 17, 2020

(30) Foreign Application Priority Data

Jun. 13, 2019 (KR) .......................... 10-2019-0069936

(51) Int. Cl.
*H05K 1/11* (2006.01)
*H05K 1/18* (2006.01)
*H05K 1/16* (2006.01)

(52) U.S. Cl.
CPC .............. *H05K 1/119* (2013.01); *H05K 1/111* (2013.01); *H05K 1/112* (2013.01); *H05K 1/115* (2013.01); *H05K 1/116* (2013.01); *H05K 1/16* (2013.01); *H05K 1/183* (2013.01); *H05K 1/185* (2013.01); *H05K 2201/09036* (2013.01); *H05K 2201/09227* (2013.01)

(58) Field of Classification Search
CPC .......... H05K 1/16; H05K 1/111; H05K 1/112; H05K 1/115; H05K 1/116; H05K 1/183; H05K 1/185; H05K 2201/09036; H05K 2201/09227; H05K 2201/09709
See application file for complete search history.

(56) References Cited

U.S. PATENT DOCUMENTS

| | | | | |
|---|---|---|---|---|
| 7,282,394 B2* | 10/2007 | Cho | ...................... | H01L 24/82 438/118 |
| 7,869,222 B2* | 1/2011 | Shih | .................... | H01L 23/5389 361/761 |
| 9,385,006 B2* | 7/2016 | Lin | ........................ | H01L 24/92 |
| 9,997,442 B1* | 6/2018 | Lin | ...................... | H05K 3/4697 |
| 10,342,135 B2* | 7/2019 | Choi | .................. | H01L 23/49811 |
| 10,674,604 B2* | 6/2020 | Ishihara | ................ | H05K 1/181 |
| 2006/0237225 A1* | 10/2006 | Kariya | .................... | H01L 24/06 174/260 |
| 2009/0107708 A1* | 4/2009 | Takahashi | .............. | H05K 1/183 174/257 |

(Continued)

FOREIGN PATENT DOCUMENTS

KR 10-2014-0122062 A 10/2014

*Primary Examiner* — Steven T Sawyer
*Assistant Examiner* — Paresh H Paghadal
(74) *Attorney, Agent, or Firm* — NSIP Law

(57) ABSTRACT

A printed circuit board includes an insulating layer including a cavity including a groove structure formed on one surface of the insulating layer, a circuit pattern including a first pad formed on a bottom surface of the cavity and a second pad formed inside the insulating layer, a first metal layer embedded in a side surface of the cavity, the first metal layer being in contact with the bottom surface of the cavity and being formed along the boundary of the cavity, and a second metal layer formed on the second pad and having a stepped structure formed with the second pad.

13 Claims, 3 Drawing Sheets

(56) References Cited

U.S. PATENT DOCUMENTS

| | | | |
|---|---|---|---|
| 2009/0215231 A1* | 8/2009 | Inoue | H01L 24/82 |
| | | | 438/125 |
| 2010/0206619 A1* | 8/2010 | Chen | H05K 1/183 |
| | | | 174/252 |
| 2014/0300001 A1 | 10/2014 | Choi et al. | |
| 2015/0022985 A1* | 1/2015 | Na | H01L 23/50 |
| | | | 361/763 |
| 2015/0107880 A1* | 4/2015 | Kim | H05K 1/185 |
| | | | 174/255 |
| 2016/0381796 A1* | 12/2016 | Lee | H05K 3/4682 |
| | | | 174/262 |
| 2017/0019989 A1* | 1/2017 | Lee | H05K 3/007 |
| 2017/0077023 A1* | 3/2017 | Tsai | H05K 1/115 |
| 2017/0171973 A1* | 6/2017 | Wu | H05K 3/0047 |

\* cited by examiner

PRINTED CIRCUIT BOARD

CROSS-REFERENCE TO RELATED APPLICATIONS

This application claims the benefit under 35 USC 119(a) of Korean Patent Application No. 10-2019-0069936 filed on Jun. 13, 2019 in the Korean Intellectual Property Office, the entire disclosure of which is incorporated herein by reference for all purposes.

BACKGROUND

1. Field

The following description relates to a printed circuit board.

2. Description of Related Art

There has been an increased demand for multi-functional, small and thin cellular phones and electronic components of information technology (IT). Accordingly, a technology of embedding electronic components, such as ICs, semiconductor chips, active devices and passive devices, into a substrate so as to meet technological demands has been required. Recently, technologies of embedding components into such a substrate by various methods have been developed.

Accordingly, various cavity structures are formed in the substrate in order to insert various components.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an insulating layer including a cavity including a groove structure formed on one surface of the insulating layer, a circuit pattern including a first pad formed on a bottom surface of the cavity and a second pad formed inside the insulating layer, a first metal layer embedded in a side surface of the cavity, the first metal layer being in contact with the bottom surface of the cavity and being formed along the boundary of the cavity, and a second metal layer formed on the second pad and having a stepped structure formed with the second pad.

The first pad and the second pad may be formed in a same layer, and the first metal layer and the second metal layer may be formed in another same layer.

The second metal layer may be wider than the second pad.

The circuit pattern may be embedded in the insulating layer and the circuit pattern may further include a conductive post formed on a side surface of the cavity, and the conductive post may be coupled to the second metal layer.

The printed circuit board may further include a solder resist layer located on the one surface of the insulating layer and may include an opening corresponding to the conductive post.

The printed circuit board may further include a conductive paste filling in the opening.

The insulating layer may include a first insulating layer including the first pad and the second pad formed on one surface of the first insulating layer, and a second insulating layer formed on the one surface of the first insulating layer and including a through region exposing the first pad.

The cavity may have a flat bottom.

In another general aspect, a printed circuit board includes an insulating layer including a cavity, a circuit pattern including a first pad formed on a bottom surface of the cavity and a second pad formed inside the insulating layer, a first metal layer, the first metal layer being in contact with the bottom surface of the cavity and being formed along the boundary of the cavity, and a second metal layer formed on the second pad, wherein the second metal layer is wider than the second pad.

The cavity may have a groove structure and may be formed on one surface of the insulating layer.

The first pad and the second pad may be formed in a same layer, and the first metal layer and the second metal layer may be formed in another same layer The first metal layer may be embedded in a side surface of the cavity.

The cavity may have a flat bottom.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
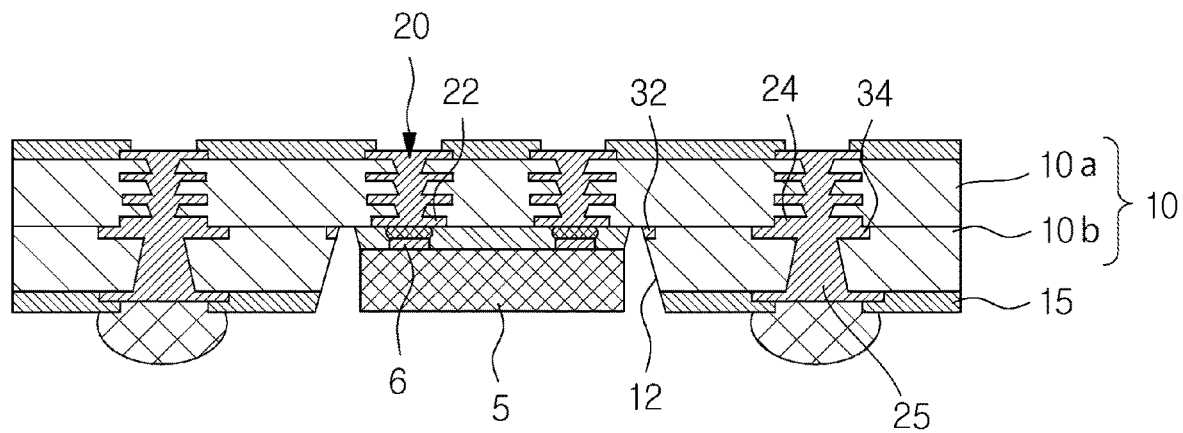
FIG. 1 is a diagram illustrating a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

When one element is described as being "connected", "coupled" or "bonded" to another element, it shall be construed as being connected, coupled or bonded to the other element directly but also as possibly having another element in between.

Hereinafter, various examples of the printed circuit board will be described individually, but it is not excluded that the description of any one example can be applied to other examples. The description of any one example may be applied to other examples as long as the relationship is compatible.

FIG. 1 is a diagram illustrating a printed circuit board according to an example.

Referring to the example of FIG. 1, a printed circuit board according to an example includes an insulating layer 10, a circuit pattern 20, a first metal layer 32, and a second metal layer 34.

The insulating layer 10 may electrically insulate the circuit pattern 20. For example, the insulating layer 10 may be a resin material. The insulating layer 10 may include a thermosetting resin such as an epoxy resin and a thermoplastic resin such as polyimide (PI), and may be formed of a prepreg (PPG) or a build-up film.

A cavity 12 in a groove structure may be formed on one surface of the insulating layer 10.

Referring to the example of FIG. 1, the cavity 12 having a flat bottomed groove may be formed on one surface of the insulating layer 10. An electronic component 5 may be inserted into the cavity 12.

The insulating layer 10 may include a first insulating layer 10a and a second insulating layer 10b. For example, the insulating layer 10 having the cavity 12 of the groove structure may be formed such that the second insulating layer 10b having a through region may be formed on one surface of the first insulating layer 10a. The first insulating layer 10a and the second insulating layer 10b may be formed of similar materials, such as in the form of a prepreg PPG or a build-up film. Alternatively, the first insulating layer 10a and the second insulating layer 10b may be formed of different materials, or formed by using different methods from each other.

Referring to the example of FIG. 1, the second insulating layer 10b may be formed with a through region for exposing the circuit pattern 20 being formed on the first insulating layer 10a. The cavity 12 may be formed so that one surface of the first insulating layer 10a may be a bottom of the cavity and a wall surface of the through region of the second insulating layer 10b may be a sidewall of the cavity 12.

The cavity 12 may also be formed more deeply by forming a third insulating layer on the second insulating layer 10b and by forming a through region to continuously pass through the second insulating layer 10b and the third insulating layer.

The circuit pattern 20 may be formed on the insulating layer 10. For example, the circuit pattern 20 may be formed of a metal, such as copper, to which an electrical signal is able to be transmitted. The circuit pattern 20 may be formed on one surface, the other surface, or on an inside of the insulating layer 10. For example, the circuit pattern 20 may include a via connecting both surfaces of the first insulating layer 10a or the second insulating layer 10b, and a pad formed on one surface or the other surface of the first insulating layer 10a or the second insulating layer 10b, and connected to the via.

In particular, the circuit pattern 20 of this example may include a first pad 22 formed on the bottom surface of the cavity 12 and a second pad 24 formed on the inside of the insulating layer 10. For example, the first pad 22 and the second pad 24 may be formed on one surface of the first insulating layer 10a. In such an example, the first pad 22 may be exposed by the through region formed in the second insulating layer 10b. In this example, the first pad 22 and the second pad 24 may be formed together, in the same layer.

Referring to the example of FIG. 1, the first pad 22 and the second pad 24 may both be formed of the circuit pattern 20 having a structure embedded in one surface of the first insulating layer 10a. For example, the embedded circuit pattern 20 may have an embedded trace substrate, in which a fine circuit is embedded in the substrate.

An upper surface of the embedded first pad 22 may form substantially the same surface with one surface of the first insulating layer 10a, so that the upper surface of the first pad 22 embedded through one surface of the first insulating layer 10a may be exposed accordingly. The fine first pad 22 of the embedded trace structure may thus be able to correspond to a fine pad 6 of the electronic element 5 inserted into the cavity 12.

The first metal layer 32 may take the form of a portion to cover the first pad 22 in the process of manufacturing the printed circuit board. Thus, the first metal layer 32 may protect the circuit pattern 20 by being a protective layer during the process of processing the cavity. The first metal layer 32 may also act as a stopper layer at which the cavity processing stops.

Most of the first metal layer 32 may be removed during the process of manufacturing the printed circuit board, but a portion of the first metal layer 32 may remain on the insulating layer 10. Specifically, the first metal layer 32 may be embedded in the side surface of the cavity 12 and formed in contact with the bottom surface of the cavity 12. That is, the first metal layer 32 may be formed at the lowermost end of the sidewall that meets the bottom of the cavity 12. The first metal layer 32 may also be formed along the boundary of the cavity 12.

Referring to the example of FIG. 1, the first metal layer 32 may be formed on one surface of the first insulating layer 10a. The first metal layer 32 may also be covered by the second insulating layer 10b so as to be interposed between the first insulating layer 10a and the second insulating layer 10b. Furthermore, a side surface of the first metal layer 32 may be exposed through the through region of the second insulating layer 10b.

The first metal layer 32 is more resistant to laser and physical processing than the insulating layer 10. Accordingly, it is also possible to effectively prevent the first pad 22 from being damaged in the process of processing the cavity 12. In particular, because the fine first pad 22 of the embedded trace structure has a very small thickness and width, the fine first pad 22 may be significantly damaged by a small error that occurs in etching or machining. Therefore, when the first metal layer 32 provides coverage as a first metal layer 32 that is excellent in corrosion resistance and mechanical abrasion resistance, the reliability and efficiency of manufacturing the printed circuit board may be improved accordingly.

The second metal layer 34 may be a portion formed on the second pad 24 and may facilitate an electrical connection with the second pad 24. The second metal layer 34 may also be formed to have a different size or shape from that of the second pad 24 and may thus have a stepped structure with the second pad 24.

Referring to the example of FIG. 1, the second metal layer 34 may be formed to be wider than the second pad 24. That is, the second metal layer 34 may have a structure that, accordingly, enlarges an area of the second pad 24.

The first metal layer 32 and the second metal layer 34 may be formed in the same layer as each other. Additionally, the first metal layer 32 and the second metal layer 34 may also be formed by the same process and may thus have similar positions and thicknesses as a result.

The circuit pattern 20 may further include a conductive post 25 embedded in the insulating layer 10 and formed on a side surface of the cavity 12. In such an example, the conductive post 25 may be connected to the second metal layer 34. The second metal layer 34 may be connected to the second pad 24 so as to be coupled with the conductive post 25 and thus, a length of the conductive post 25, that is, the depth of the conductive post 25 in the thickness direction of the insulating layer 10, may be shortened as compared with the alternative example in which the second pad 24 and the conductive post 25 are directly connected to one another. Therefore, in such an example, the conductive post 25 having a high reliability may be formed. The second metal layer 34 thus provides a larger area than the second pad 24. As a result, the reliability of the electrical connection with respect to the conductive post 25 may also be increased accordingly.

The printed circuit board of this example may further include a solder resist layer 15 situated on one surface of the insulating layer 10.

Referring to the example of FIG. 1, the solder resist layer 15 may have an opening corresponding to the conductive post 25. The opening may be filled with a conductive paste such as a solder paste, so that the printed circuit board may be connected to another substrate or the electronic element 5, such as being electrically and/or physically connected.

The printed circuit board of this example may be used in an electronic component package.

The electronic component package according to this example may include the above-described printed circuit board and the electronic component 5.

Accordingly, the electronic component 5 may be disposed in the cavity 12 of the printed circuit board.

Referring to the example of FIG. 1, a pad of the electronic component 5 disposed in the cavity 12 may be connected to the first pad 22. A gap between the printed circuit board and the electronic element 5 may be filled with underfill, in such an example.

FIG. 2 to FIG. 9 are diagrams illustrating a method for manufacturing printed circuit board according to an example.

Figure 2:
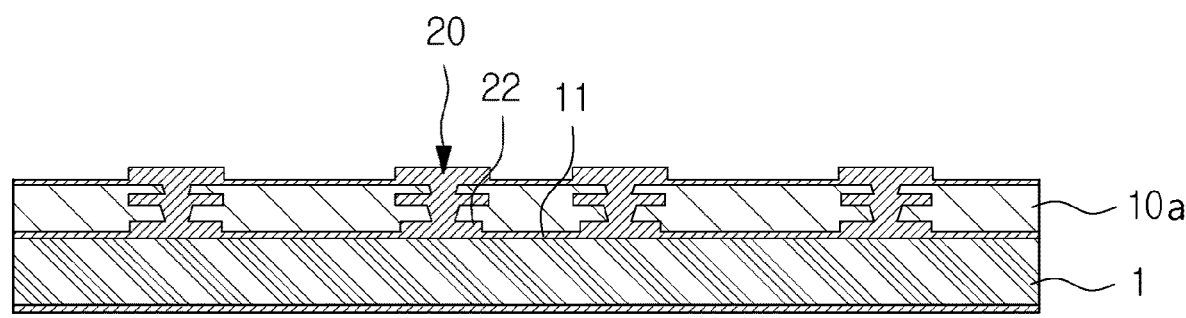
FIG. 2 to FIG. 9 are diagrams illustrating a method for manufacturing printed circuit board according to an example.

Referring to the example of FIG. 2, a circuit pattern 20 may be formed on one surface of a first insulating layer 10a. The circuit pattern 20 may also be formed on the other surface or inside of the first insulating layer 10a. The circuit pattern 20 may include an embedded circuit pattern 20. In such an example, the embedded circuit pattern 20 may have a circuit structure of an embedded trace substrate, in which a fine circuit is embedded in the substrate. The fine circuit of the embedded trace structure may interact with a fine pad 6 of an electronic element 5.

The first insulating layer 10a and the circuit pattern 20 may be formed on both surfaces of a carrier substrate 1 including a release layer. For example, a metal layer may be formed by a plating process, and the patterning process may be performed through selective etching. The circuit pattern 20 may be formed by applying a conductive metal material on the release layer of the carrier substrate 1. The patterning process may be performed by employing a tenting process, a modified semi-additive process, a semi-additive process or a similar, appropriate patterning process.

After the circuit pattern 20 is formed on the carrier substrate 1, the first insulating layer 10a may be pressed and laminated onto the carrier substrate 1 to embed the circuit pattern 20 in the first insulating layer 10a. In such an example, the first insulating layer 10a may be a semi-cured prepreg layer. Alternatively, the first insulating layer 10a may be formed by applying an insulating resin to the carrier substrate 1 to embed the circuit pattern 20 in the carrier substrate 1. The circuit pattern 20 may also be additionally formed on the inside or the other surface of the first insulating layer 10a laminated on the carrier substrate 1. Thus, the circuit pattern 20 on the carrier substrate 1 may have an embedded structure surrounded by the first insulating layer 10a.

Figure 3:
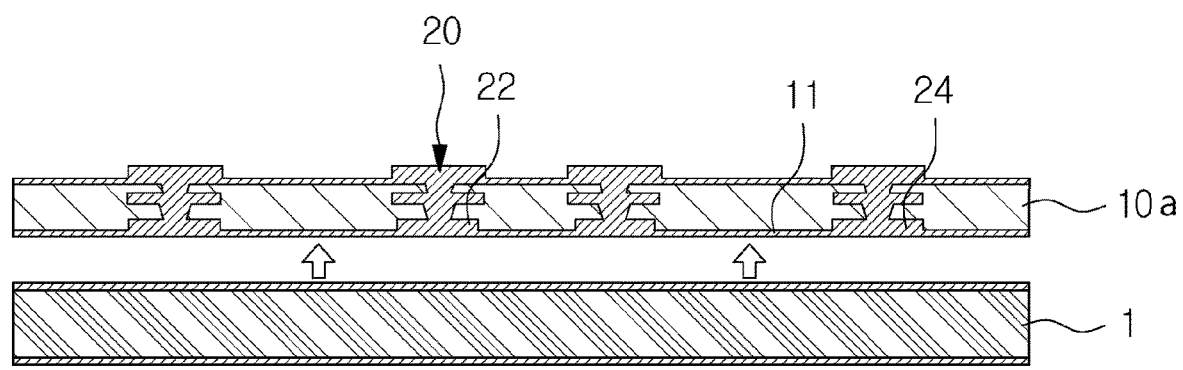

Referring to the example of FIG. 3, when the first insulating layer 10a, on which the circuit pattern 20 is formed, is separated from the carrier substrate 1, the circuit pattern 20 may include an embedded first pad 22 and an embedded second pad 24, both exposed to one surface of the first insulating layer 10a. A seed layer 11 may be formed on the one surface of the first insulating layer 10a in contact with the carrier substrate 1 so that the first pad 22 and the second pad 24 may be connected to the seed layer 11 accordingly.

Referring to the example of FIG. 4 and the example of FIG. 5, an area of a cavity 12 may be set on the first insulating layer 10a, and a first metal layer 32 may be then formed subsequently. Additionally, a second metal layer 34 may be formed on the second pad 24.

Figure 4:
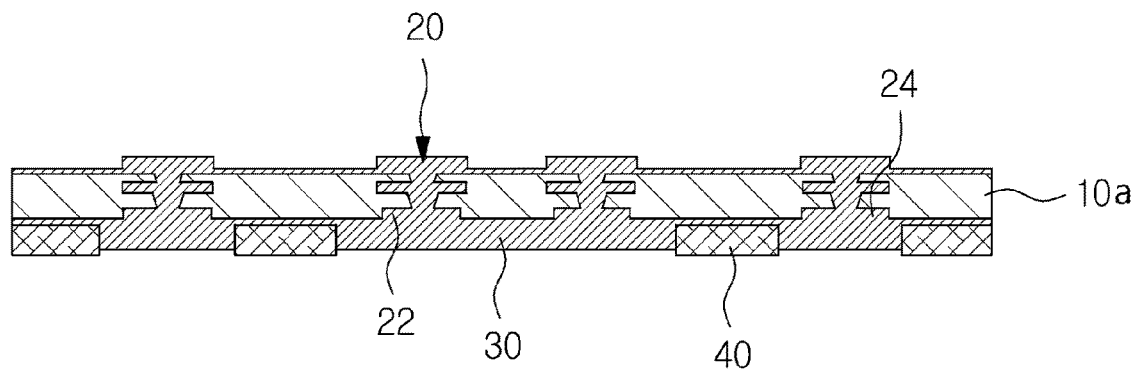
Figure 5:
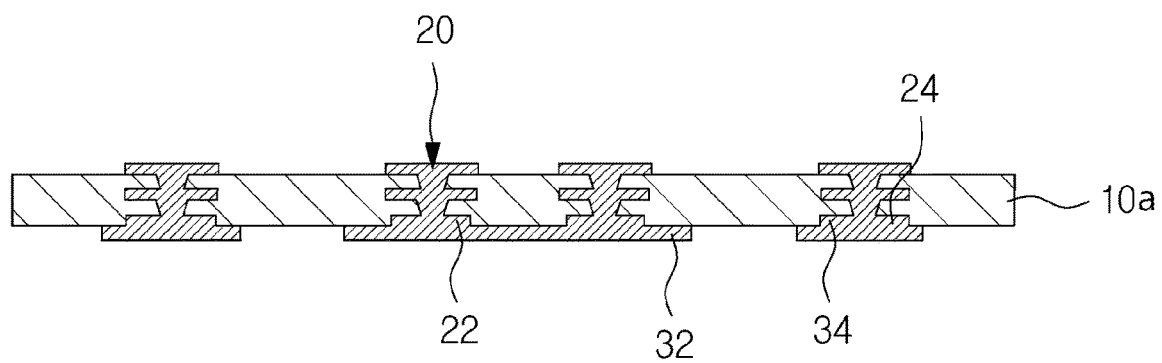

Referring to the example of FIG. 4 and FIG. 5, after forming a plating resist 40 selectively exposing a region where the first metal layer 32 and the second metal layer 34 are to be formed on the seed layer 11 of the first insulating layer 10a, a metal layer 30 including the first metal layer 32 and the second metal layer 34 may be formed appropriately on the seed layer 11.

Referring to the example of FIG. 5, the plating resist 40 may be removed and the seed layer 11 may be removed as well by etching to separate the first metal layer 32 and the second metal layer 34 from one another.

Figure 6:
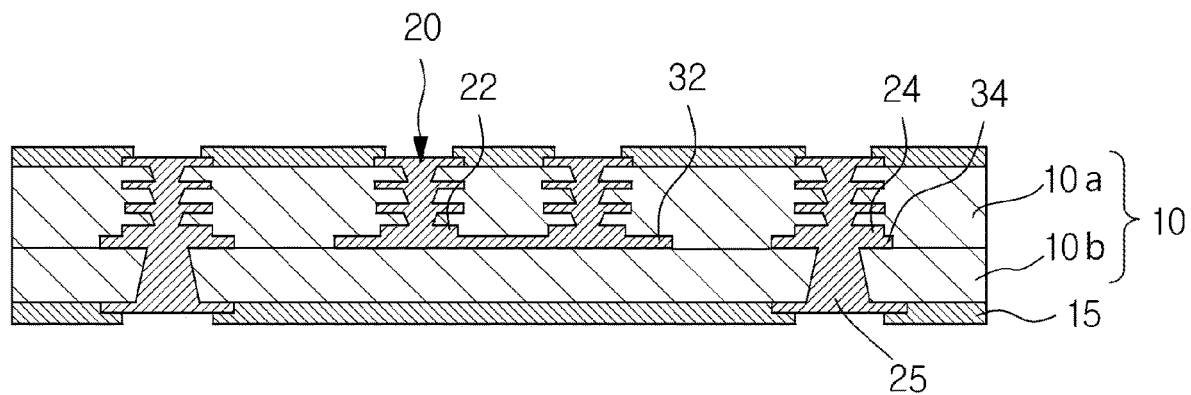

Referring to the example of FIG. 6, the second insulating layer 10b may be formed on one surface of the first insulating layer 10a. The second insulating layer 10b may be formed of a similar material to the first insulating layer 10a, taking the form of a prepreg (PPG) or a build-up film. Alternatively, the first insulating layer 10a and the second insulating layer 10b may be formed of different materials or by different methods from each other, and need not be formed of the same or similar materials, in another example.

The second insulating layer 10b used for embedding the first metal layer 32 and the second metal layer 34 may be laminated onto one surface of the first insulating layer 10a. In such an example, a conductive post 25 connected to the second metal layer 34 through the second insulating layer 10b may also be formed. For example, a post made of a material such as copper may be coupled to the second metal layer 34.

Figure 7:
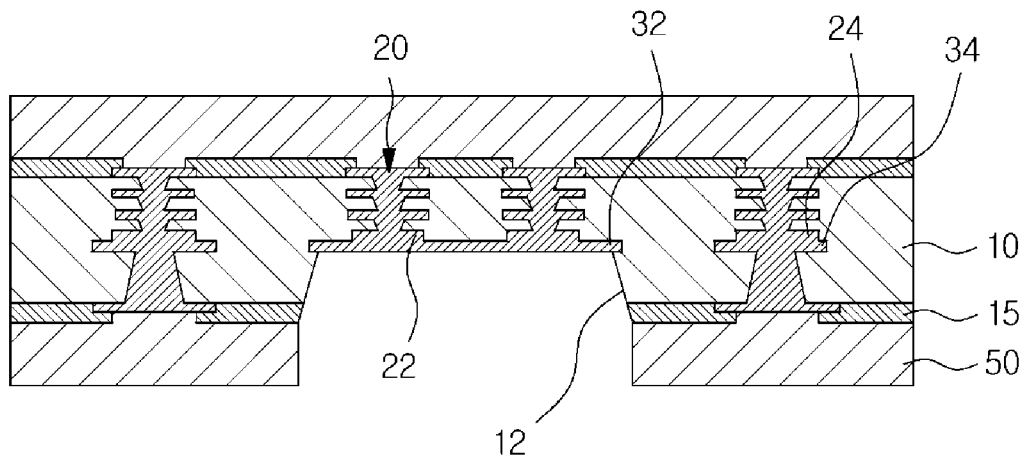

Referring to the example of FIG. 7, the second insulating layer 10b may be selectively removed to form a cavity 12 having a groove structure. In particular, the cavity 12 may be formed in the second insulating layer 10b so as to have a recessed groove structure in which an electronic element 5 or the like may be inserted and arranged in the cavity 12. The first metal layer 32 may be exposed through the through region.

In this example, the cavity 12 may be processed by a sandblasting process to selectively remove the second insulating layer 10b. When the cavity 12 is processed in this manner, the first metal layer 32 may serve as a stopper for limiting a depth of the processing.

Sandblasting is a method of finishing or grinding a surface by spraying an abrasive from a nozzle. In the past, such a process was named "sandblasting" because sand was sprayed as the blast abrasive. However, various particles such as ceramic powders such as alumina (aluminum oxide) or silicon carbide, glass beads, plastic powder and the like have been used as an abrasive at present, instead of or in addition to using sand as the abrasive. There are two types of sandblasting. One type of sandblasting is a wet sandblasting that uses a mixture of a blast abrasive and water for spraying it from a nozzle. The other type of sandblasting is a dry sandblasting that uses an airflow to propel only blast abrasive, without water being part of the sandblasting process.

An anti-processing layer may be formed on the second insulating layer 10b to selectively cover an unprocessed area and the second insulating layer 10b may be processed by sandblasting to expose an upper part of the first metal layer 32. In such an example, because the first metal layer 32 is made of a material having a high wear resistance, the first metal layer 32 may be more slightly worn or cut by sandblasting, as compared with the second insulating layer 10b. Accordingly, even if the sandblasting is sufficiently performed until the first metal layer 32 is exposed at the central portion of the cavity 12, the first pad 22 may be prevented from being damaged by carrying out the sandblasting in this manner.

Figure 8:
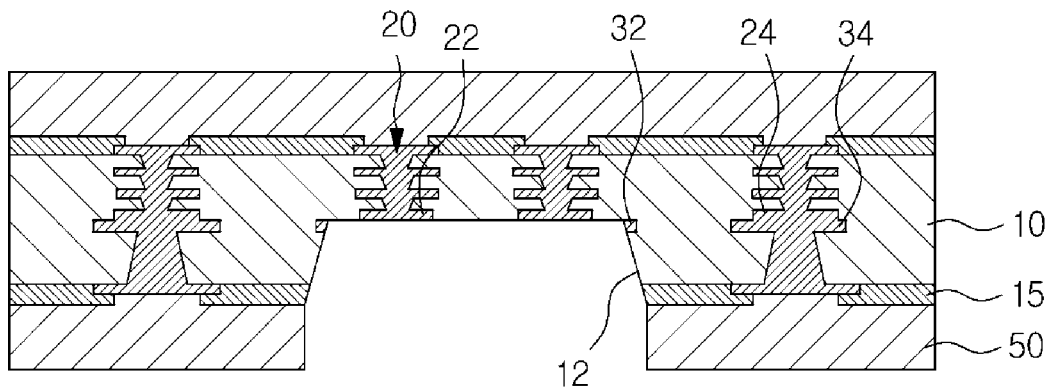

Referring to the example of FIG. 8, the first metal layer 32 in the cavity 12 may be removed to expose the embedded first pad 22. For example, the first metal layer 32 may be removed by etching. Most of the first metal layer 32 may be removed, but a part of the first metal layer 32 may remain embedded in the side wall of the cavity 12.

Figure 9:
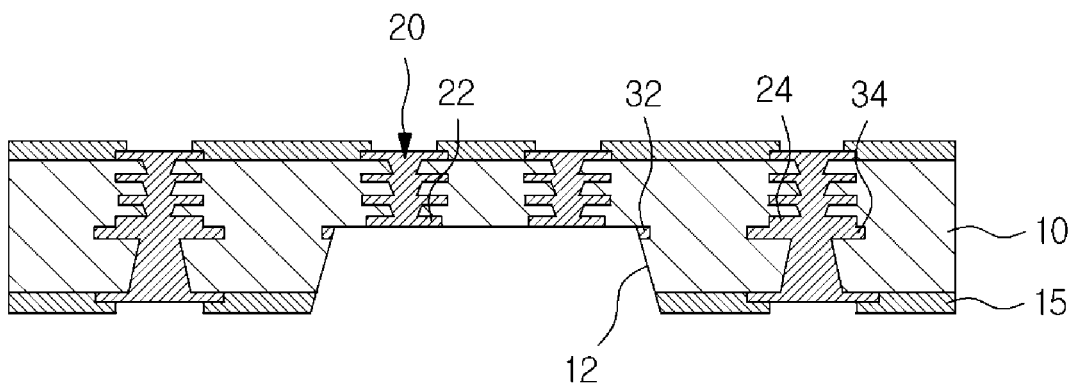

Referring to the example of FIG. 9, the anti-processing layer 50 may be removed from the second insulating layer 10b. Here, one surface and the other surface of the insulating layer 10 become outer layers of the printed circuit board. A solder resist layer 15 may be further formed on the insulating layer 10. A part of the conductive post 25 or the circuit pattern 20 may be exposed through an opening of the solder resist layer 15 to cause such a part to be electrically connected to the outside.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
an insulating layer comprising a cavity comprising a groove structure formed on one surface of the insulating layer;
a circuit pattern comprising a first pad formed on a bottom surface of the cavity and a second pad formed inside the insulating layer;
a first metal layer exposed through a side surface of the cavity and partially embedded in the insulating layer, the first metal layer being in contact with the bottom surface of the cavity and being formed along the boundary of the cavity; and
a second metal layer formed on the second pad and having a stepped structure formed with the second pad,
wherein the first pad and the second pad are embedded in a same layer, the first metal layer and the second metal layer are coplanar and have a same thickness, the second metal layer is wider than the second pad, and the first pad and the second pad are coplanar and have a same thickness.

2. The printed circuit board of claim 1, wherein the first metal layer and the second metal layer are formed in another same layer.

3. The printed circuit board of claim 1, wherein the circuit pattern is embedded in the insulating layer and the circuit pattern further comprises a conductive post formed on a side surface of the cavity, and
wherein the conductive post is coupled to the second metal layer.

4. The printed circuit board of claim 3, further comprising a solder resist layer located on the one surface of the insulating layer and comprising an opening corresponding to the conductive post.

5. The printed circuit board of claim 4, further comprising a conductive paste filling in the opening.

6. The printed circuit board of claim 1, wherein the insulating layer comprises:
a first insulating layer comprising the first pad and the second pad formed on one surface of the first insulating layer; and
a second insulating layer formed on the one surface of the first insulating layer and comprising a through region exposing the first pad.

7. The printed circuit board of claim 1, wherein the cavity has a flat bottom.

8. A printed circuit board comprising:
an insulating layer comprising a cavity comprising a groove structure formed on one surface of the insulating layer;
a circuit pattern comprising a first pad formed on a bottom surface of the cavity and a second pad formed inside the insulating layer;
a first metal layer exposed through a side surface of the cavity and partially embedded in the insulating layer, the first metal layer being in contact with the bottom surface of the cavity and being formed along the boundary of the cavity; and
a second metal layer formed on the second pad and having a stepped structure formed with the second pad,
wherein the second metal layer is wider than the second pad, the first metal layer and the second metal layer are coplanar and have a same thickness, and the first pad and the second pad are coplanar and have a same thickness.

9. A printed circuit board comprising:
an insulating layer comprising a cavity;
a circuit pattern comprising a first pad formed on a bottom surface of the cavity and a second pad formed inside the insulating layer;
a first metal layer, the first metal layer being in contact with the bottom surface of the cavity and being formed along the boundary of the cavity; and
a second metal layer formed on the second pad,
wherein the second metal layer is wider than the second pad, the second pad is embedded in the insulating layer, the first metal layer and the second metal layer are coplanar and have a same thickness, and the first pad and the second pad are coplanar and have a same thickness, and the second metal layer formed on the second pad and having a stepped structure formed with the second pad.

10. The printed circuit board of claim 9, wherein the cavity has a groove structure and is formed on one surface of the insulating layer.

11. The printed circuit board of claim 9, wherein the first pad and the second pad are formed in a same layer, and the first metal layer and the second metal layer are formed in another same layer.

12. The printed circuit board of claim 9, wherein the first metal layer is exposed on through a side surface of the cavity and partially embedded in the insulating layer.

13. The printed circuit board of claim 9, wherein the cavity has a flat bottom.

* * * * *